(12) United States Patent
Oh et al.

(10) Patent No.: US 11,845,090 B2
(45) Date of Patent: Dec. 19, 2023

(54) NOZZLE APPARATUS, APPARATUS AND METHOD FOR TREATING SUBSTRATE

(71) Applicant: SEMES CO., LTD., Cheonan-si (KR)

(72) Inventors: Chang Suk Oh, Cheonan-si (KR); Woo Sin Jung, Yeoju-si (KR); UnKyu Kang, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 774 days.

(21) Appl. No.: 16/918,341

(22) Filed: Jul. 1, 2020

(65) Prior Publication Data
US 2021/0001357 A1 Jan. 7, 2021

(30) Foreign Application Priority Data
Jul. 2, 2019 (KR) .................. 10-2019-0079238

(51) Int. Cl.
*B05B 1/16* (2006.01)
*B05B 7/06* (2006.01)
(Continued)

(52) U.S. Cl.
CPC .............. *B05B 1/16* (2013.01); *B05B 7/061* (2013.01); *B05B 7/062* (2013.01); *B05B 12/00* (2013.01); *B05B 12/04* (2013.01); *B05B 14/00* (2018.02); *B05B 15/555* (2018.02); *B05B 16/20* (2018.02); *B08B 3/02* (2013.01); *G03F 7/162* (2013.01); *G03F 7/3021* (2013.01); *H01L 21/02052* (2013.01); *H01L 21/02057* (2013.01); *H01L 21/6715* (2013.01); *H01L 21/67051* (2013.01); *H01L 21/67178* (2013.01);
(Continued)

(58) Field of Classification Search
None
See application file for complete search history.

(56) References Cited

U.S. PATENT DOCUMENTS

| 9,776,199 B2 | 10/2017 | Kubota |
| 2013/0161408 A1 | 6/2013 | Wurz |

FOREIGN PATENT DOCUMENTS

| CN | 1729059 A | 2/2006 |
| CN | 101273442 A | 9/2008 |

(Continued)

OTHER PUBLICATIONS

Hwan Ik Noh, "KR20140090588A English Machine Translation. pdf", Jul. 17, 2014—Machine translation from Espacenet.com.*

(Continued)

*Primary Examiner* — Levon J Shahinian
(74) *Attorney, Agent, or Firm* — Harness, Dickey & Pierce, P.L.C.

(57) ABSTRACT

An apparatus for performing liquid treatment for a substrate is provided. The apparatus for performing the liquid treatment for the substrate may include a housing having a treatment space, a substrate support unit to support and rotate the substrate in the treatment space, a liquid feeding unit including a nozzle device including a central exhaust port and multiple first outer exhaust ports, which are provided in a shape of a ring to form a concentric circle with the central exhaust port to feed mutually different treating liquids onto the substrate through respective exhaust ports, and a controller to control the liquid feeding unit.

18 Claims, 13 Drawing Sheets

(51) Int. Cl.
  *B05B 12/00* (2018.01)
  *B05B 12/04* (2006.01)
  *B05B 14/00* (2018.01)
  *B05B 15/555* (2018.01)
  *B05B 16/20* (2018.01)
  *B08B 3/02* (2006.01)
  *G03F 7/16* (2006.01)
  *G03F 7/30* (2006.01)
  *H01L 21/02* (2006.01)
  *H01L 21/67* (2006.01)
  *H01L 21/687* (2006.01)

(52) U.S. Cl.
  CPC .. *H01L 21/67259* (2013.01); *H01L 21/68764* (2013.01); *Y02P 70/10* (2015.11)

(56) References Cited

FOREIGN PATENT DOCUMENTS

| | | |
|---|---|---|
| CN | 101585029 A | 11/2009 |
| CN | 104730866 A | 6/2015 |
| DE | 2504932 A1 | 2/1976 |
| DE | 10116051 A1 | 10/2002 |
| JP | H09-47698 A | 2/1997 |
| JP | 2004-006618 A | 1/2004 |
| JP | 2008-112837 A | 5/2008 |
| JP | 4762098 B2 | 8/2011 |
| KR | 101017102 B1 | 2/2011 |
| KR | 2014-0090588 A | 7/2014 |
| KR | 101746346 B1 | 6/2017 |

OTHER PUBLICATIONS

Office Action dated Apr. 20, 2022 in Chinese Application No. 202010632152.9.
Office Action for corresponding Korean Application No. 10-2019-0079238 dated Sep. 16, 2020.

\* cited by examiner

NOZZLE APPARATUS, APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0079238 filed on Jul. 2, 2019, in the Korean Intellectual Property Office, the entire contents of which are hereby incorporated by reference.

BACKGROUND

Embodiments of the inventive concept described herein relate to an apparatus and a method for performing liquid treatment for a substrate.

Among substrate manufacturing processes, a photo-lithography process is to form a desired pattern on a wafer. The photo-lithography process is connected to exposing equipment and performed in spinner local equipment to sequentially perform a coating process, an exposing process, and a developing process. The spinner local equipment sequentially or selectively performs a hexamethyl disilazane (HMDS) process, a coating process, a bake process, and a developing process.

In this case, the coating process is a process to coat a photoresist liquid onto the surface of a substrate. When the nozzle to coat the photoresist liquid stands by in a home port, a nozzle surface is periodically cleaned by a dummy dispense and a solvent.

However, although the nozzle surface is cleaned by spraying the solvent when the nozzle stands by in the home port, the teaching position is finely varied, so nozzles have mutually different cleaning states.

In addition, as illustrated in FIG. 1, when the photoresist liquid is coated, the nozzle surface is contaminated as the photoresist liquid is abnormally scattered, or static electricity is produced on the nozzle surface. As the nozzle is continuously used, the size of the contamination is increased, and a defect is caused, so the PM period is shortened.

SUMMARY

Embodiments of the inventive concept provide a nozzle apparatus and an apparatus and a method for treating a substrate, capable of preventing a nozzle from being contaminated.

Embodiments of the inventive concept provide a nozzle apparatus and an apparatus and a method for treating a substrate, capable of improving uniformity in a shape of spraying a photoresist liquid.

Embodiments of the inventive concept provide a nozzle apparatus and an apparatus and a method for treating a substrate, capable of increasing a PM period.

The objects of the inventive concept are not limited to the above, but other effects, which are not mentioned, will be apparently understood to those skilled in the art.

According to an exemplary embodiment, there may be provided a nozzle apparatus including a first nozzle having a central exhaust port, and a second nozzle having a first outer exhaust port provided in a shape of ring to form a concentric circle with the central exhaust port.

In addition, the central exhaust port and the first outer exhaust port may be provided to have mutually different exhaust heights.

In addition, the central exhaust port may be positioned to be provided more closely to the substrate treatment surface than the first outer exhaust port.

In addition, a first treating liquid exhausted from the first nozzle may be different from a second treating liquid exhausted from the second nozzle.

Further, the first treating liquid may include a photosensitive liquid, and the second treating liquid may include a solvent.

In addition, the nozzle apparatus may further include a nozzle controller to control the first nozzle and the second nozzle, and the nozzle controller may control the second nozzle to clean a surface of the first nozzle using the second treating liquid, before exhausting the first treating liquid from the first nozzle.

Further, the nozzle controller may control the first nozzle and the second nozzle to exhaust the second treating liquid together with the first treating liquid, such that flowability of the first treating liquid is increased on a substrate surface, when the first treating liquid is exhausted from the first nozzle.

In addition, the nozzle controller may control the second nozzle such that a start time point of exhausting the second treating liquid is earlier than a start time point of exhausting the first treating liquid, and an end time point of exhausting the second treating liquid is later than an end time point of exhausting the first treating liquid.

In addition, the nozzle apparatus may further include a third nozzle having a second outer exhaust port provided in a shape of a ring to form a concentric circle with the central exhaust port, and the third nozzle may be provided to surround the second nozzle.

Further, the second outer exhaust port may be provided farther away from the substrate treatment surface than the first outer exhaust port.

In addition, a third treating liquid exhausted from the third nozzle may include a drying fluid.

According to an exemplary embodiment, there may be provided a method for treating a substrate, which includes performing liquid feeding by feeding, by a first nozzle, a first treating liquid onto the substrate, and adjusting a thickness of the liquid film formed on the substrate, after performing the liquid feeding. The performing of the liquid feeding may include cleaning, by a second nozzle, a surface of the first nozzle using a second treating liquid, before exhausting the first treating liquid from the first nozzle.

In addition, the performing of the liquid feeding may include feeding the first treating liquid onto the substrate, together with the second treating liquid, when feeding the first treating liquid onto the substrate.

Further, in the performing of the liquid feeding, a start time point of exhausting the second treating liquid may be earlier than a start time point of exhausting the first treating liquid, and an end time point of exhausting the first treating liquid may be earlier than an end time point of exhausting the second treating liquid.

In addition, the method may further include performing pre-wetting to change a surface state of the substrate to a wet state, before the performing of the liquid feeding, and drying the liquid film on the substrate, after adjusting the thickness of the liquid film.

In addition, the performing of the pre-wetting may include feeding the second treating liquid from the second nozzle onto the substrate.

Further, the first treating liquid may include a photosensitive liquid, and the second treating liquid may include a solvent.

According to an exemplary embodiment, there may be provided an apparatus for treating a substrate, which may include a housing having a treatment space, a substrate support unit to support and rotate the substrate in the treatment space, a liquid feeding unit including a nozzle device including a central exhaust port and multiple first outer exhaust ports, which are provided in a shape of a ring to form a concentric circle with the central exhaust port, to feed mutually different treating liquids onto the substrate through respective exhaust ports, and a controller to control the liquid feeding unit.

In addition, the central exhaust port and the first outer exhaust port may be provided to have mutually different exhaust heights.

The central exhaust port may be positioned to be provided more closely to the substrate treatment surface than the first outer exhaust port.

In addition, the controller may control the liquid feeding unit to exhaust a second treating liquid through the first outer exhaust ports such that a peripheral portion of the central exhaust port is cleaned, before exhausting a first treating liquid from the central exhaust port.

Further, the controller may control the liquid feeding unit to exhaust, through the first outer exhaust port, a second treating liquid together with a first treating liquid, such that flowability of the first treating liquid is increased on a substrate surface, when the first treating liquid is exhausted from the central exhaust port.

Further, the controller may control the liquid feeding unit such that a start time point of exhausting the second treating liquid is earlier than a start time point of exhausting the first treating liquid, and an end time point of exhausting the first treating liquid is earlier than an end time point of exhausting the second treating liquid.

Further, the first treating liquid may include a photosensitive liquid, and the second treating liquid may include a solvent.

In addition, the nozzle device may further include a second outer exhaust port provided in a shape of a ring to surround the first outer exhaust port while forming a concentric circle with the central exhaust port, and the second outer exhaust port may be provided in a stepped form to be farther away from the substrate treatment surface than the first outer exhaust port.

In addition, a third treating liquid exhausted from the third nozzle may include a drying fluid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
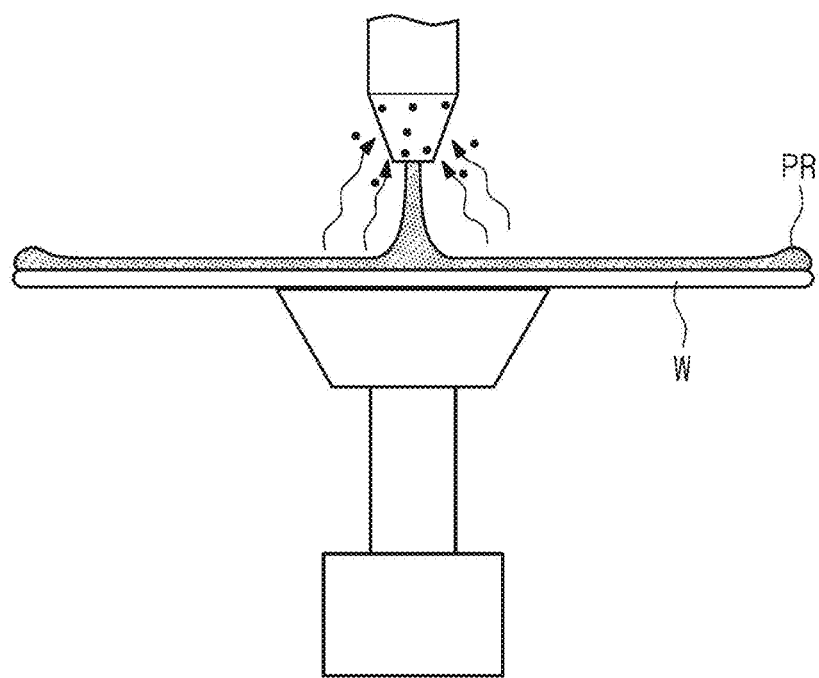
FIG. 1 is a view illustrating a nozzle contaminated used in a typical coating process.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

According to the present embodiment, equipment may be used to perform a photo-lithography process on a substrate such as a semiconductor wafer or a flat panel display panel. In particular, according to the inventive concept, the equipment may be connected to an exposing device and used to perform a coating process and a developing process. Hereinafter, the case that a wafer is used as a substrate by way of example.

Hereinafter, substrate treating equipment will be described with reference to FIGS. 2 to 11.

Figure 2:
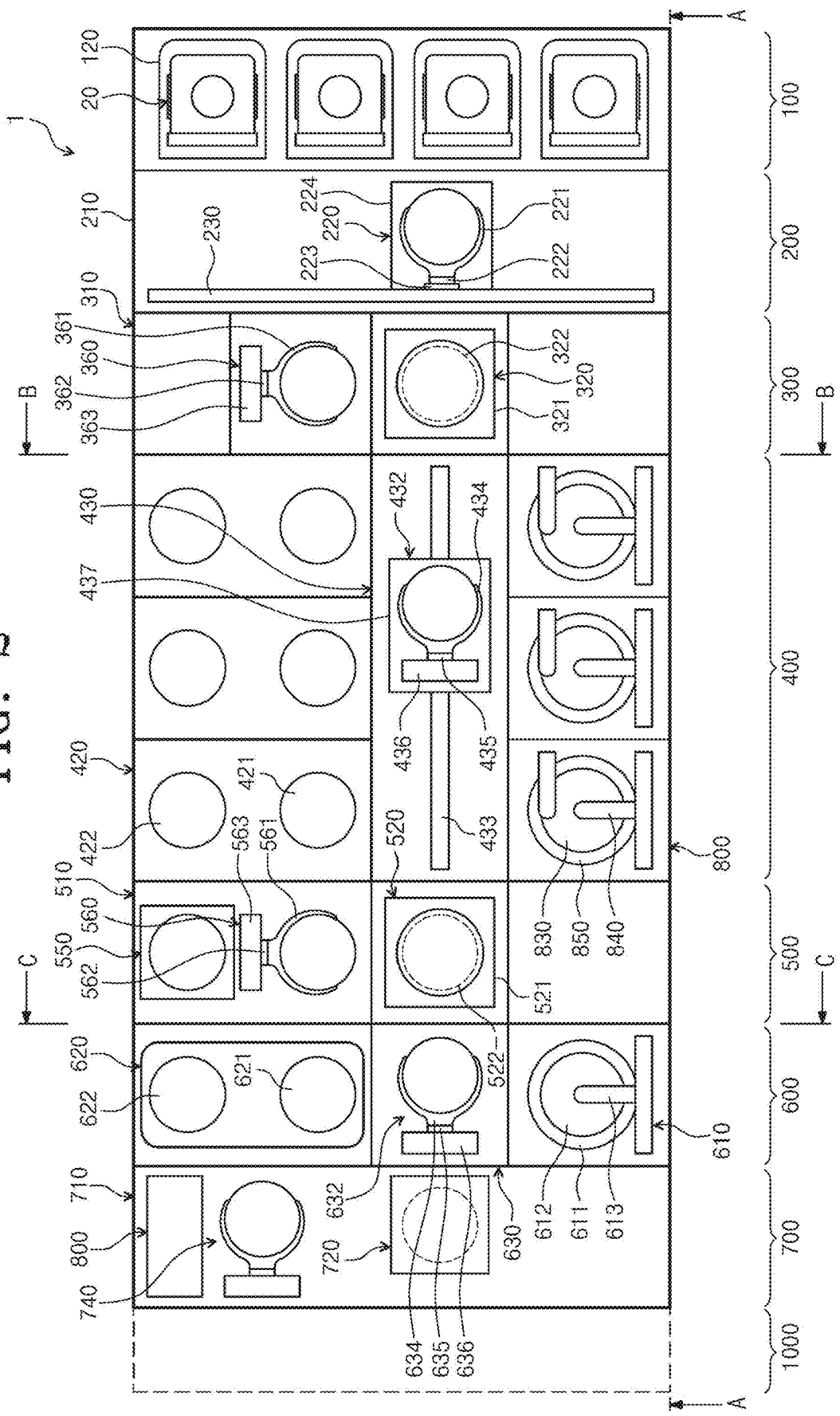
FIG. 2 is a plan view illustrating a substrate treating equipment, according to a first embodiment of the inventive concept.
Figure 3:
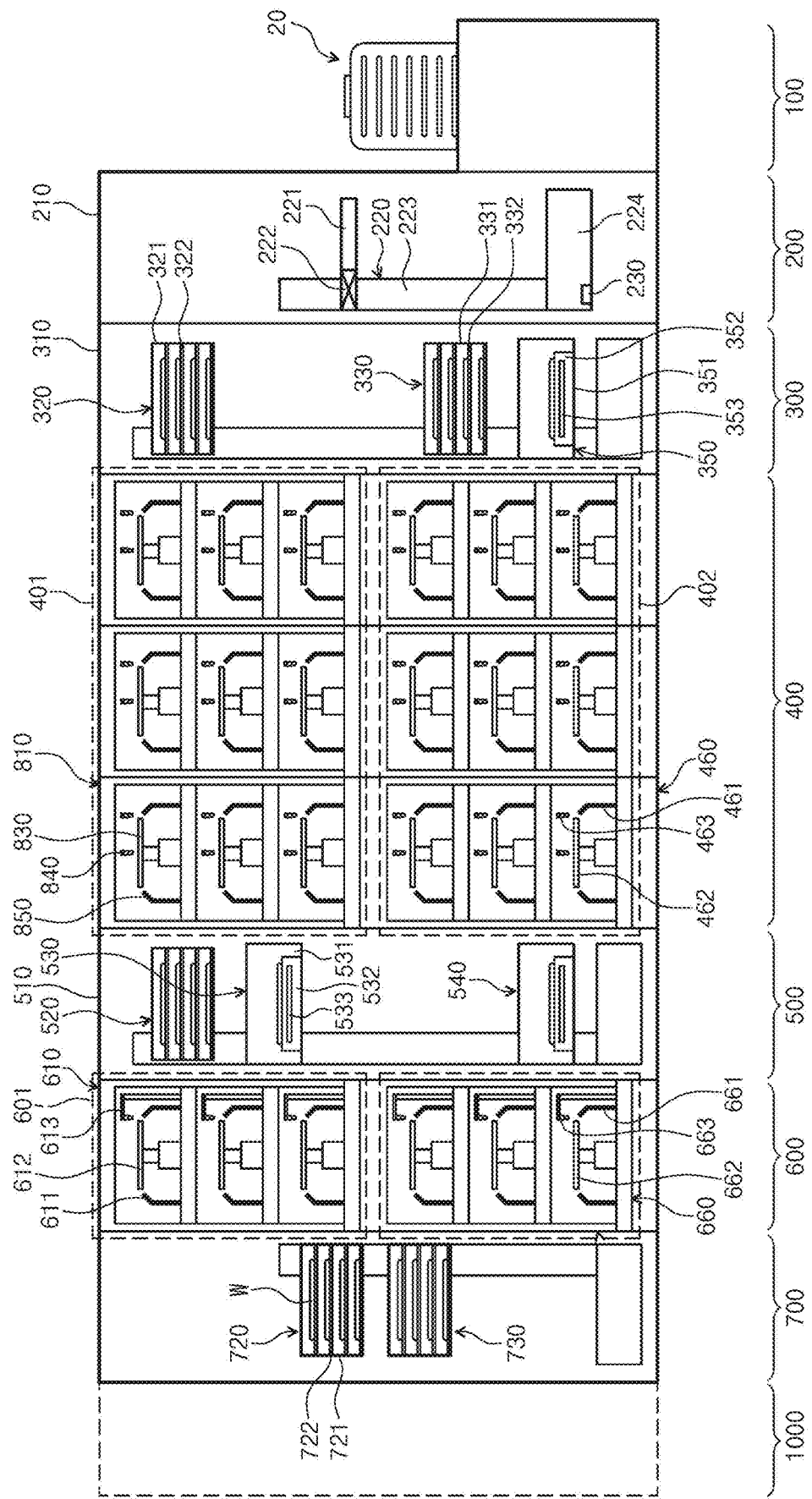
FIG. 3 is a view illustrating the substrate treating equipment of FIG. 2 when viewed in a direction of A-A.
Figure 4:
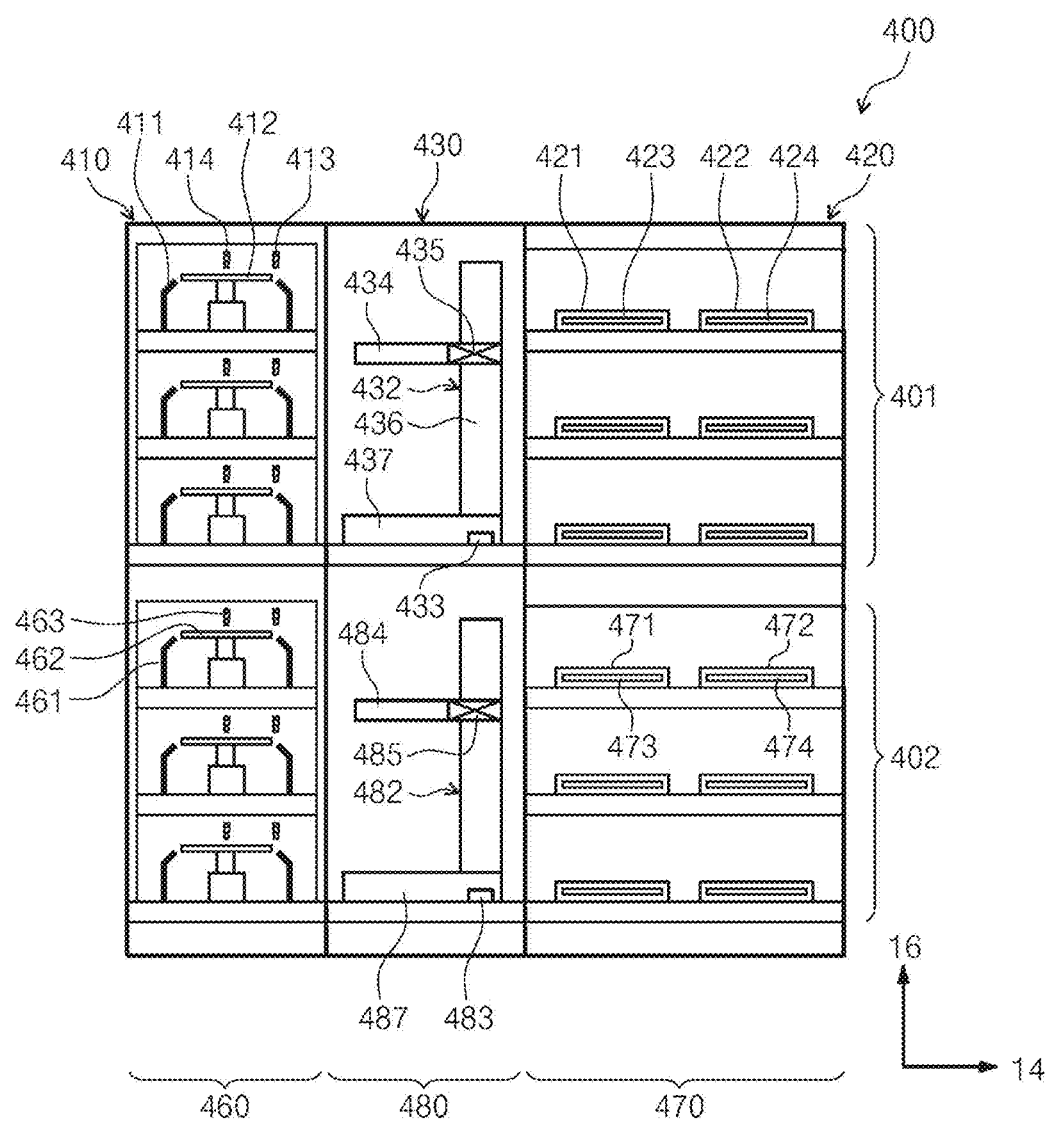
FIG. 4 is a view illustrating the substrate treating equipment of FIG. 2 when viewed in a direction of B-B.
Figure 5:
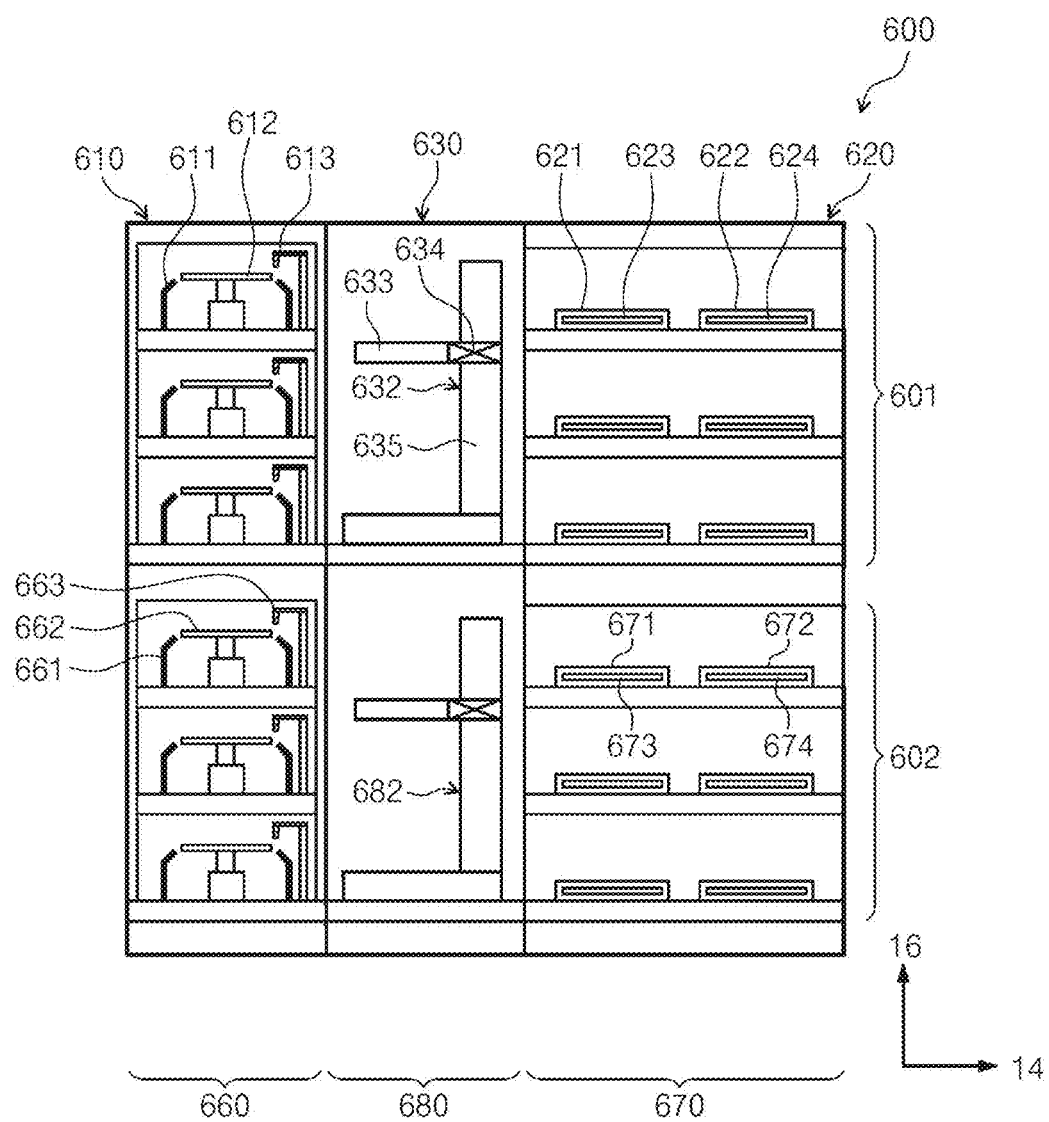
FIG. 5 is a view illustrating the substrate treating equipment of FIG. 2 when viewed in a direction of C-C.

FIG. 2 is a plan view illustrating a substrate treating equipment, FIG. 3 is a view illustrating the substrate treating equipment of FIG. 2 when viewed in a direction of A-A, FIG. 4 is a view illustrating the substrate treating equipment of FIG. 2 when viewed in a direction of B-B, and FIG. 5 is a view illustrating the substrate treating equipment of FIG. 2 when viewed in a direction of C-C.

Referring to FIGS. 2 to 5, the substrate treating equipment 1 includes a load port 100, an index module 200, a first buffer module 300, a coating/developing module 400, a second buffer module 500, a pre/post-exposure treatment module 600, and an interface module 700. The load port 100, the index module 200, the first buffer module 300, the coating/developing module 400, the second buffer module 500, the pre/post-exposure treatment module 600, and the interface module 700 are sequentially disposed in a row in one direction.

Hereinafter, a direction in which the load port 100, the index module 200, the first buffer module 300, the coating/developing module 400, the second buffer module 500, the pre/post-exposure treatment module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate 'W' is moved while being received in a cassette 20. In this case, the cassette 20 has a structure that is sealed from the outside. For example, a front open unified pod (FOUP) that has a door on the front side may be used as the cassette 20.

Hereinafter, the load port 100, the index module 200, the first buffer module 300, the coating/developing module 400, the second buffer module 500, the pre/post-exposure treatment module 600, and the interface module 700 will be described in detail.

The load port 100 has a carrier 120 on which the cassette 20 having the substrates W received therein is placed. A plurality of carriers 120 are provided, and are disposed along the second direction 14 in a row. In FIG. 2, four carriers 120 are provided.

The index module 200 transfers the substrate 'W' between the cassette 20 placed on the carrier 120 of the load port 100 and the first buffer module 300. The index module 200 has a frame 210, an index robot 220, and a guide rail 230. The frame 210 has a substantially rectangular parallelepiped shape having a hollowed structure, and is interposed between the load part 100 and the first buffer module 300. The frame 210 of the index module 200 may be provided at a height lower than that of a frame 310 of the first buffer module 300, which will be described below. The index robot 220 and the guide rail 230 are disposed in the frame 210. The index robot 220 has a four-axis driven structure allowing a hand 221 thereof directly handling the substrate 'W' to be movable and rotatable in the first direction 12, the second direction 14, and the third direction 16. The index robot 220 has the hand 221, an arm 222, a support 223, and a prop 224. The hand 221 is fixedly installed in the arm 222. The arm 222 has an extensible and rotatable structure. The support 223 has a longitudinal direction provided in the third direction 16. The arm 222 is coupled to the support 223 movably along the support 223. The support 223 is fixedly coupled to the prop 224 The guide rail 230 has a longitudinal direction provided in the second direction 14. The prop 224 is coupled to the guide rail 230 to be linearly movable along the guide rail 230. Although not illustrated, the frame 210 further includes a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having a hollowed structure, and is interposed between the index module 200 and the coating/developing module 400. The first buffer 320, the second buffer 330, the cooling chamber 350, and the first buffer robot 360 are positioned within the frame 310. The cooling chamber 350, the second buffer 330, and the first buffer 320 are arranged in the third direction 16 sequentially from the bottom The first buffer 320 is positioned at a height corresponding to a coating module 401 of the coating/developing module 400, which will be described below, and the second buffer 330 and the cooling chamber 350 are positioned at a height corresponding to a developing module 402 of the coating/developing module 400, which will be described below. A first buffer robot 360 is spaced apart from the second buffer 330, the cooling chamber 350, and the first buffer 320 by a specific distance in the second direction 14.

The first buffer 320 and the second buffer 330 temporarily store a plurality of substrates 'W'. The second buffer 330 has a housing 331 and a plurality of supports 332. The supports 332 are disposed inside the housing 331, and are spaced apart from each other in the third direction 16. One substrate 'W' is placed on each of the supports 332. The housing 331 has openings (not illustrated) in directions of providing the index robot 220, the first buffer robot 360, and a developing robot 482 of the developing module 402 to be described below such that the index robot 220, the first buffer robot 360, and the developing robot 482 introduce or withdraw the substrate 'W' into or out of the support 332 provided inside the housing 331. The first buffer 320 has a structure substantially similar to that of the second buffer 330. Meanwhile, the housing 331 of the first buffer 320 has openings in directions of providing the first buffer robot 360 and a coating robot 432 situated in the coating module 401 to be described below. The number of supports 332 provided in the first buffer 320 may be equal to or different from the number of supports 332 provided in the second buffer 330. According to an embodiment, the number of the supports 332 provided in the second buffer 330 may be larger than the number of the supports 332 provided in the first buffer 320.

The first buffer robot 360 transfers the substrate 'W' between the first buffer 320 and the second buffer 330. The first buffer robot 360 has a hand 361, an arm 362, and a support 363. The hand 361 is fixedly installed in the arm 362. The arm 362 has an extensible structure such that the hand 361 is movable in the second direction 14. The arm 362 is coupled to the support 363 to be linearly movable in the third direction 16 along the support 363. The support 363 has a length extending from a position corresponding to the second buffer 330 to a position corresponding to the first buffer 320. The support 363 may be provided to extend longer upwards or downward. The first buffer robot 360 may be provided such that the hand 361 is simply two-axis driven along the second direction 14 and the third direction 16.

The cooling chamber 350 cools the substrate 'W'. The cooling chamber 350 has a housing 351 and a cooling plate 352. The cooling plate 352 has a top surface on which the substrate 'W' is positioned and a cooling unit 353 that cools the substrate 'W'. Various types such as a cooling type using cooling water and a cooling type using a thermoelectric element may be used for the cooling unit 353. A lift pin assembly (not illustrated) may be provided in the cooling chamber 350 to position the substrate 'W' on the cooling plate 352. The housing 351 has openings (not illustrated) in directions of providing the index robot 220 and the developing robot 482, which is provided in the developing module 402 to be described below, such that the index robot 220 and the developing robot 482 introduce or withdraw the substrate 'W' into or out of the cooling plate 352. In addition, doors (not illustrated) that open and close the openings may be provided in the cooling chamber 350.

The coating/developing module 400 performs a process of coating a photoresist on a substrate 'W' before an exposing process and a process of developing the substrate 'W' after the exposing process. The coating/developing module 400 has a substantially rectangular parallelepiped shape. The coating/developing module 400 has a coating module 401 and a developing module 402. The coating module 401 and the developing module 402 may be disposed to be partitioned from each other in different layers. According to an example, the coating module 401 is situated on the developing module 402.

The coating module 401 performs a process of coating a photosensitive liquid, such as a photoresist, on a substrate 'W' and a heat treatment process of, for example, heating and cooling the substrate 'W' before and after the resist coating process. The coating module 401 has a resist coating chamber 410, a bake chamber 420, and a carrying chamber 430. The resist coating chamber 410, the bake chamber 420, and the carrying chamber 430 are sequentially disposed in the second direction 14. Accordingly, the resist coating chamber 410 and the bake chamber 420 are spaced apart from each other in the second direction 14 while the carrying chamber 430 is interposed therebetween. A plurality of resist coating chambers 410 may be provided in each of the first direction 12 and the third direction 16. In the drawings, six resist coating chambers 410 are illustrated by way of example. A plurality of bake chamber 420 may be provided in each of the first direction 12 and the third direction 16. In the drawings, six resist bake chambers 420 are illustrated by way of example. However, unlike this, a larger number of bake chambers 420 may be provided.

The carrying chamber 430 is positioned in parallel to the first buffer 320 of the first buffer module 300 in the first direction 12. A coating robot 432 and a guide rail 433 may be positioned in the carrying chamber 430. The carrying chamber 430 has a substantially rectangular shape. The coating robot 432 transfers a substrate 'W' between the bake chambers 420, the resist coating chambers 410, the first buffer 320 of the first buffer module 300, and the first cooling chamber 520 of the second buffer module 500. The guide rail 433 is disposed such that the longitudinal direction thereof is parallel to the first direction 12. The guide rail 433 guides the coating robot 432 such that the coating robot 432 linearly moves in the first direction 12. The coating robot 432 has a hand 434, an arm 435, a support 436, and a prop 437. The hand 434 is fixedly mounted on the arm 435. The arm 435 has an extensible structure such that the hand 434 is movable horizontally. The support 436 is disposed such that a longitudinal direction thereof is provided in the third direction 16. The arm 435 is coupled to the support 436 to be linearly movable along the support 436 in the third direction 16. The support 436 is fixedly coupled to the prop 437, and the prop 437 is coupled to the guide rail 433 to be movable along the guide rail 433.

The resist coating chambers 410 have the same structure. However, the resist coating chambers 410 may employ mutually different types of photoresists. For example, a chemical amplification resist may be used as the photoresist. The resist coating chamber 410 serves as an apparatus (substrate treating apparatus) for treating a substrate 'W' to coat the photoresist onto the substrate 'W'. A substrate treating apparatus 800 performs a liquid coating process, and the details thereof will be described later with reference to FIGS. 6 to 7.

Referring back to FIGS. 2 to 5, the bake chamber 420 heat-treats the substrate 'W'. For example, the bake chambers 420 perform a prebake process of eliminating organic substances and moisture from the surface of the substrate 'W' by heating the substrate 'W' at a predetermined temperature before coating the photoresist or a soft bake process performed after coating a photoresist to the substrate 'W', and performs a cooling process of cooling the substrate 'W' after the heating processes. The bake chamber 420 has the cooling plate 421 and the heating plate 422. The cooling plate 421 includes the cooling unit 423 such as cooling water or a thermoelectric element. The heating plate 422 includes a heating unit 424 such as a heating wire or a thermoelectric element. The cooling plate 421 and the heating plate 422 may be provided in one bake chamber 420. Alternatively, some of the bake chambers 420 may include only a cooling plate 421, and some of the bake chambers 420 may include only a heating plate 422.

The developing module 402 performs a developing process of eliminating a portion of the photoresist by supplying a developer to obtain a pattern on the substrate 'W', and a heat treatment process, such as heating and cooling, which are performed with respect to the substrate 'W' before and after the developing process. The developing module 402 has a developing chamber 460, a bake chamber 470, and a carrying chamber 480. The developing chamber 460, the bake chamber 470, and the carrying chamber 480 are sequentially disposed in the second direction 14. Accordingly, the developing chamber 460 and the bake chamber 470 are spaced apart from each other in the second direction 14 while the carrying chamber 480 is interposed therebetween. A plurality of developing chamber 460 may be provided in each of the first direction 12 and the third direction 16. In the drawings, six developing chambers 460 are illustrated by way of example. A plurality of bake chamber 470 may be provided in each of the first direction 12 and the third direction 16. In the drawings, six resist bake chambers 470 are illustrated by way of example. However, unlike this, a larger number of bake chambers 470 may be provided.

The carrying chamber 480 is positioned in parallel to the first buffer 330 of the first buffer module 300 in the first direction 12. A developing robot 482 and a guide rail 483 may be positioned in the carrying chamber 480. The developing chamber 480 has a substantially rectangular shape. The developing robot 482 transfers the substrate 'W' among the bake chambers 470, the developing chambers 460, the cooling chamber 350 of the second buffer 330 in the first buffer module 300, and the second cooling chamber 540 of the second buffer module 500. The guide rail 483 is disposed such that the longitudinal direction thereof is parallel to the first direction 12. The guide rail 483 guides the developing robot 482 such that the developing robot 482 linearly moves in the first direction 12. The developing robot 482 has a hand 484, an arm 485, a support 486, and a prop 487. The hand 484 is fixedly mounted in the arm 485. The arm 485 has an extensible structure such that the hand 484 is movable horizontally. The support 486 is provided such that a longitudinal direction thereof is provided in the third direction 16. The arm 485 is coupled to the support 486 to be linearly movable along the support 486 in the third direction 16. The support 486 is fixedly coupled to the prop 487. The prop 487 is coupled to the guide rail 483 to be linearly movable along the guide rail 483.

The developing chambers 460 have the same structure. However, the types of developing liquids used in the developing chambers 460 are mutually different from each other. The developing chambers 460 remove a region, to which light is irradiated, of the photoresist coated on the substrate 'W'. In this case, even a region, to which light is irradiated, of a protective film is removed together. Alternatively, only regions, to which light is not irradiated, of the photoresist and the protective film, may be removed depending on the types of the photoresist.

The developing chamber 460 has a vessel 461, a support plate 462, and a nozzle 463. The vessel 461 has the shape of a cup having an open upper portion. The support plate 462 is positioned inside the vessel 461 and supports the substrate 'W'. The support plate 462 is rotatably provided. The nozzle 463 feeds a developing liquid onto the substrate 'W' placed on the support plate 462. The nozzle 463, which has a cylindrical tubular shape, supplies the developing liquid to the center of the substrate 'W'. Alternatively, the nozzle 463 has a length corresponding to the diameter of the substrate 'W' and an exhaust port of the nozzle 463 may be provided in the form of a slit. Additionally, the developing chamber 460 may further include a nozzle 464 feeding a cleaning liquid, such as deionized water, to clean the surface of the substrate 'W' to which the developing liquid is additionally supplied.

The bake chamber 470 is to perform heat treatment for the substrate 'W'. The bake chambers 470 may perform a post bake process of heating the substrate 'W' before the developing process, a hard bake process of heating the substrate 'W' after the developing process, and a cooling process of cooling the heated wafer (substrate) after the bake process. The bake chamber 470 has the cooling plate 471 or the heating plate 472. The cooling plate 471 includes the cooling unit 473 such as cooling water or a thermoelectric element. The heating plate 472 includes the heating unit 474 such as a heating wire or a thermoelectric element. The cooling plate 471 and the heating plate 472 may be provided in one bake chamber 470. Alternatively, some of the bake chambers 470 may include only a cooling plate 471, and others of the bake chambers 470 may include only a heating plate 472.

As described above, the coating/developing module 400 is provided such that the coating module 401 and the developing module 402 are separated from each other. When viewed from the top, the coating module 401 and the developing module 402 may have the same chamber arrangement.

The second buffer module 500 is provided as a passage through which the substrate 'W' is transported, between the coating/developing module 400 and the pre/post-exposure treatment module 600. In addition, the second buffer module 500 performs a specific process, such as a cooling process or an edge exposing process, with respect to the substrate 'W'. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the coating module 401. The second cooling chamber 540 is disposed at a height corresponding to the developing module 402. The buffer 520, the first cooling chamber 530, and the second cooling chamber 540 are disposed in a row in the third direction 16. When viewed from the top, the buffer 520 is disposed along the carrying chamber 430 of the coating module 401 in the first direction 12. The edge exposing chamber 550 is spaced apart from the buffer 520 or the first cooling chamber 530 by a specific distance in the second direction 14.

The second buffer robot 560 transports the substrate 'W' between the buffer 520, the first cooling chamber 530, and the edge exposing chamber 550. The second buffer robot 560 is interposed between the edge exposing chamber 550 and the buffer 520. The second buffer robot 560 may have a structure that is similar to that of the first buffer robot 360. The first cooling chamber 530 and the edge exposing chamber 550 perform the subsequent processes with respect to the substrates W which has been subject the process in the coating module 401. The first cooling chamber 530 cools the substrate 'W' subject to the process in the coating module 401. The first cooling chamber 530 has a structure similar to that of the cooling chamber 350 of the first buffer module 300. The edge exposing chamber 550 exposes the edge regions of substrates 'W' subject to the cooling process in the first cooling chamber 530. The buffer 520 temporarily stores the substrates W before the substrates W subject to the exposing process in the edge exposing chamber 550 are transported to a pre-treatment module 601 to be described below. The second cooling chamber 540 cools wafers (substrates) 'W' before the wafers 'W' subject to the process in a post-treatment module 602, which will be described below, are transported to the developing module 402. The second buffer module 500 may further have a buffer at a height corresponding to the developing module 402. In this case, the wafers 'W' subject to the process in the post-treatment module 602 may be transported to the developing module 402 after being temporarily stored in the buffer which is further provided.

When an exposure apparatus 1000 performs an immersing/exposing process, the pre/post-exposure treatment module 600 may perform a process of coating a protective film that protects the photoresist film coated to the substrate 'W' during the immersing/exposing process. The pre/post-exposure treatment module 600 may perform a process of cleaning the substrate 'W' after the exposing process. Furthermore, when the coating process is performed by using a chemical amplification resist, the pre/post-exposure treatment module 600 may perform a bake process after the exposing process.

The pre/post-exposure treatment module 600 has a pre-treatment module 601 and a post-treatment module 602. The pre-treatment module 601 performs a process of treating the substrate 'W' before the exposing process, and the post-treatment module 602 performs a process of treating the substrate 'W' after the exposing process. The pre-treatment module 601 and the post-treatment module 602 may be disposed to be partitioned from each other in different layers. According to an example, the pre-treatment module 601 is positioned on the post-treatment module 602. The pre-treatment module 601 has the same height as that of the coating module 401. The post-treatment module 602 has the same height as that of the developing module 402. The pre-treatment module 601 has a protective film coating chamber 610, a bake chamber 620, and a carrying chamber 630. The protective film coating chamber 610, the carrying chamber 630, and the bake chamber 620 are sequentially disposed along the second direction 14. Accordingly, the protective film coating chamber 610 and the bake chamber 620 are spaced apart from each other in the second direction 14 while the carrying chamber 630 is interposed therebetween. A plurality of protective film coating chambers 610 are provided and arranged in the third direction 16 such that the protective film coating chambers 610 are stacked on each other. Alternatively, a plurality of protective film coating chambers 610 may be provided in each of the first direction 12 and the third direction 16. A plurality of bake chambers 620 are provided and arranged in the third direction 16 such that the protective film coating chambers 610 are stacked on each other. Alternatively, a plurality of bake chambers 620 may be provided in each of the first direction 12 and the third direction 16.

The carrying chamber 630 is positioned in parallel to the first cooling chamber 530 of the second buffer module 500 in the first direction 12. A pre-treatment robot 632 is positioned inside the carrying chamber 630. The carrying chamber 630 has a substantially square or rectangular shape. The pre-treatment robot 632 transfers the substrate 'W' among the protective film coating chambers 610, the bake chambers 620, the buffer 520 of the second buffer modules 500, and the first buffer 720 of the interface module 700 to be described below. The pre-treatment robot 632 has a hand 633, an arm 634, and a support 635. The hand 633 is fixedly installed in the arm 634. The arm 634 has an extensible and rotatable structure. The arm 634 is coupled to the support 635 to be linearly movable along the support 635 in the third direction 16.

The protective film coating chamber 610 applies a protective film onto the substrate 'W' to protect the resist film in the liquid immersion lithography process. The protective film coating chamber 610 has a housing 611, a support plate 612, and a nozzle 613. The housing 611 has the shape of a cup having an open upper portion. The support plate 612 is positioned inside the housing 611 and supports the substrate 'W'. The support plate 612 is rotatably provided. The nozzle 613 feeds a protecting liquid onto the substrate 'W' placed on the support plate 612 to form a protective film. The nozzle 613, which has a cylindrical tubular shape, supplies the protecting liquid to the center of the substrate 'W'. Alternatively, the nozzle 613 has a length corresponding to the diameter of the substrate 'W' and an exhaust port of the nozzle 613 may be provided in the form of a slit. In this case, the support plate 612 may be provided in a fixed state. The protecting liquid includes a foamable material. The protecting liquid may include a material having a lower affinity with a photoresist and water. For example, the protecting liquid may contain a fluorine-based solvent. The protective film coating chambers 610 feeds the protecting liquid to the central region of the substrate 'W' while rotating the substrate 'W' placed on the support plate 612.

The bake chamber 620 performs heat treatment with respect to the substrate 'W' having the protective film. The bake chamber 620 has the cooling plate 621 and the heating plate 622. The cooling plate 621 includes the cooling unit 623 such as cooling water or a thermoelectric element. The heating plate 622 includes the heating unit 624 such as a heating wire or a thermoelectric element. The heating plate 622 and the cooling plate 621 may be provided in one bake chamber 620. Alternatively, some of the bake chambers 620 may include only the heating plate 622, and others of the bake chambers 620 may include only the cooling plate 621.

The post-treatment module 602 has a cleaning chamber 660, a post-exposure bake chamber 670, and a carrying chamber 680. The cleaning chamber 660, the carrying chamber 680, and the post-exposure bake chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of bake chambers 660 are provided and arranged in the third direction 16 such that the bake chambers 660 are stacked on each other. Alternatively, a plurality of cleaning chambers 660 may be provided in the first direction 12 and the third direction 16. A plurality of post-exposure bake chambers 670 are provided and arranged in the third direction 16 such that the post-exposure bake chambers 670 are stacked on each other. Alternatively, a plurality of post-exposure bake chambers 670 may be provided in the first direction 12 and the third direction 16.

The carrying chamber 680 is positioned in parallel to the second buffer 540 of the second buffer module 500 in the second direction 12, when viewed from above. The carrying chamber 680 has a substantially square or rectangular shape. A post-treatment robot 682 is positioned inside the carrying chamber 680. The post-treatment robot 682 carries the substrate 'W' among the cleaning chambers 660, the post-exposure bake chambers 670, the second cooling chamber 540 of the second buffer module 500, and the second buffer 730 of the interface module 700 to be described below. The post-treatment robot 682 provided in the post-treatment module 602 may have the same structure as that of the pre-treatment robot 632 provided in the pre-treatment module 601.

The cleaning chamber 660 cleans the substrate 'W' after the exposing process. The cleaning chamber 660 has a housing 661, a support plate 662, and a nozzle 663. The housing 661 has the shape of a cup having an open upper portion. The support plate 662 is positioned inside the housing 661 and supports the substrate 'W'. The support plate 662 is rotatably provided. The nozzle 663 feeds photoresist onto the substrate 'W' placed on the support plate 662. The cleaning liquid may include water such as deionized water. The cleaning chambers 660 feeds the cleaning liquid to the central region of the substrate 'W' while rotating the substrate 'W' placed on the support plate 662. Alternatively, while the substrate 'W' is being rotated, the nozzle 663 may linearly move or move while rotating, from the central region of the substrate 'W' to the edge region of the substrate 'W'.

The post-exposure bake chamber 670 heats the substrate 'W' subject to the exposing process using ultraviolet rays. The post-base process is to amplify acid generated in the photoresist through exposure by heating the substrate 'W', thereby completing the change of a property of the photoresist. The post-exposure bake chamber 670 has a heating plate 672. The heating plate 672 includes the heating unit 674 such as a heating wire or a thermoelectric element. The post-exposure bake chamber 670 may further include the cooling plate 671 provided therein. The cooling plate 671 includes the cooling unit 673 such as cooling water or a thermoelectric element. In addition, alternatively, a bake chamber having only the cooling plate 671 may be further provided.

As described above, the pre-treatment module 601 and the post-treatment module 602 are provided to be completely separated from each other, in the pre/post-exposure treatment module 600. In addition, the carrying chamber 630 of the pre-treatment module 601 and the carrying chamber 680 of the post-treatment module 602 may be provided in equal size, and may be provided to be completely overlapped with each other when viewed from above. In addition, the protective film coating chamber 610 and the cleaning chamber 620 may be provided in an equal size to be completely overlapped with each other when viewed from above. In addition, the bake chamber 620 and the post-exposure bake chamber 670 may be provided in equal size and may be provided to be completely overlapped with each other when viewed from above.

The interface module 700 transfers the substrate 'W' between the pre/post-exposure treatment module 600 and the exposure apparatus 1000. The interface module 700 has a frame 710, a first buffer 720, a second buffer 730, and an interface robot 740. The first buffer 720, the second buffer 730, and the interface robot 740 are positioned in the frame 710. The first buffer 720 and the second buffer 730 are spaced apart from each other by a specific distance, and are disposed to be stacked on each other. The first buffer 720 is disposed higher than the second buffer 730. The first buffer 720 is positioned at a height corresponding to the pre-treatment module 601, and the second buffer 730 is positioned at a height corresponding to the post-treatment module 602. When viewed from above, the first buffer 720 is aligned in line with the carrying chamber 630 of the pre-treatment module 601 in the first direction 12, and the second buffer 730 is aligned in line with the carrying chamber 630 of the post-treatment module 602 in the first direction 12.

The interface robot 740 is positioned to be spaced apart from the first buffer 720 and the second buffer 730 in the second direction 14. The interface robot 740 transports the substrate 'W' among the first buffer 720, the second buffer 730, and the exposure apparatus 1000. The interface robot 740 has a structure substantially similar to that of the second buffer robot 560.

The first buffer 720 temporarily stores the substrate 'W', which is subject to the process in the pre-treatment module 601, before the substrate 'W' is moved to the exposure apparatus 1000. In addition, the second buffer 730 temporarily stores the substrates 'W', which are completely subject to a process in the exposure apparatus 1000, before the substrate 'W' is moved to the post-treatment module 602. The first buffer 720 has a housing 721 and a plurality of supports 722. The supports 722 are disposed inside the housing 721, and are spaced apart from each other in the third direction 16. One substrate 'W' is placed on each of the supports 722. The housing 721 has openings (not illustrated) in directions of providing the interface robot 740 and the pre-treatment robot 632 such that the interface robot 740 and the pre-treatment robot 632 introduce or withdraw the substrate 'W' into or out of the support 722 in the housing 721. The second buffer 730 has a structure substantially similar to that of the first buffer 720. However, the housing 721 of the second buffer 730 has an opening (not illustrated) in the direction of providing the interface robot 740 and in the direction of providing the post-processing robot 682. The interface module may include only buffers and a robot as described above without providing a chamber to perform a specific process with respect to the wafer.

Figure 6:
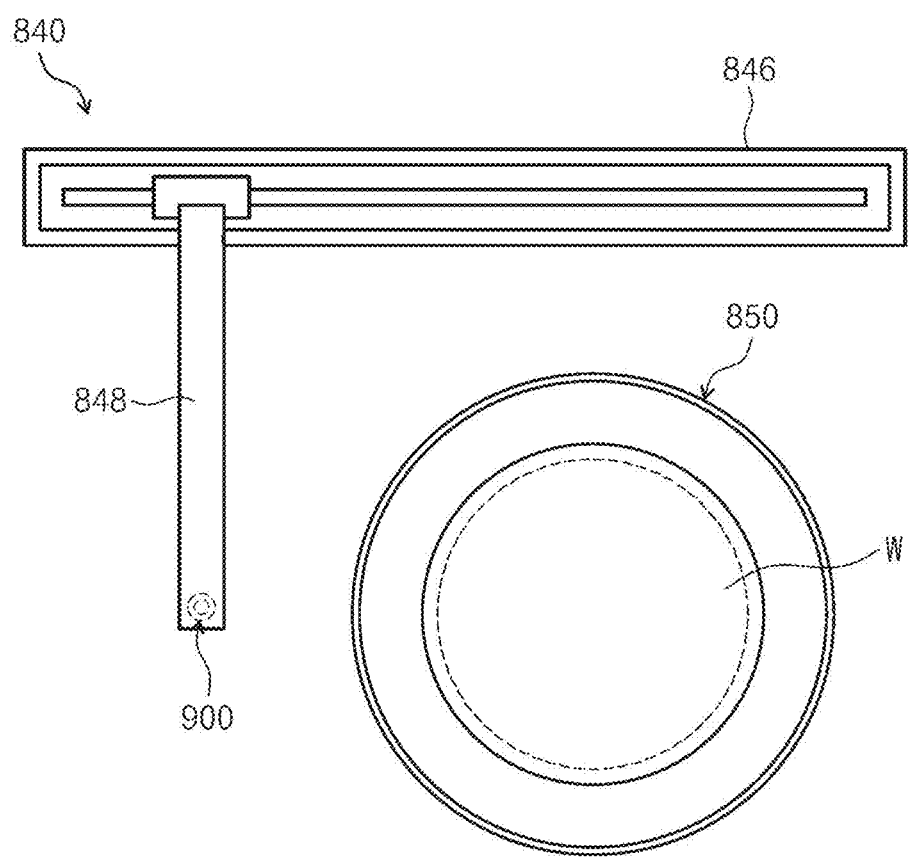
FIG. 6 is a plan view illustrating the substrate treating apparatus of FIG. 2.
Figure 7:
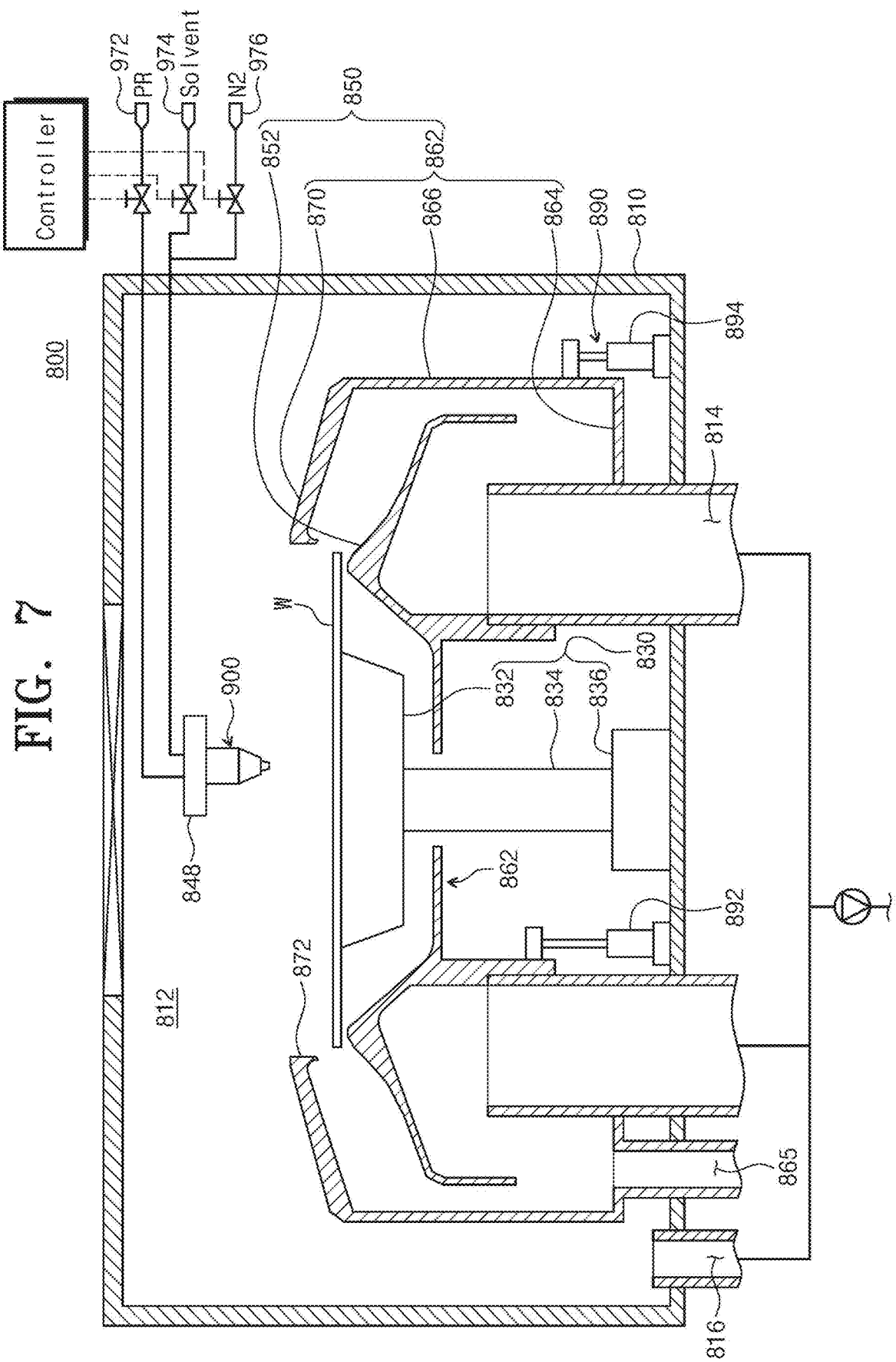
FIG. 7 is a sectional view illustrating the substrate treating apparatus of FIG. 2.

FIG. 6 is a plan view illustrating the substrate treating apparatus in FIG. 2, and FIG. 7 is a sectional view illustrating the substrate treating apparatus in FIG. 2.

Referring to FIGS. 6 and 7, the substrate treating apparatus 800 may include a housing 810, a substrate support unit 830, a treating bowl 850, an elevating unit 890, a liquid feeding unit 840, and a controller 880.

The housing 810 is provided in the shape of a rectangular tub having a treatment space 812 provided therein. An opening (not illustrated) is formed in one side of the housing 810. The opening serves as an entrance through which the substrate 'W' is introduced or withdrawn. A door is installed in the opening to open or close the opening. The door seals the treatment space 812 of the housing 810 by closing the opening when a substrate treatment process is performed. The housing 810 is formed in a bottom surface thereof with an inner exhaust port 814 and an outer exhaust port 816. An air flow formed in the housing 810 is exhausted to the outside through the inner exhaust port 814 and the outer exhaust port 816. According to an example, the air flow provided in the treating bowl 850 may be exhausted through the inner exhaust port 814 and the air flow provided outside the treating bowl 850 may be exhausted through the outer exhaust port 816.

The substrate support unit 830 supports the substrate "W" in a treatment space 812 of the housing 810. The substrate support unit 830 rotates the substrate 'W'. The substrate support unit 830 includes a spin chuck 832, a rotating shaft 834, and a driver 836. The spin chuck 832 serves as a substrate support member 832 to support the substrate 'W'. The spin chuck 832 is provided to have the shape of a circular plate. The substrate 'W' contacts a top surface of the spin chuck 832. The spin chuck 832 is provided to have a diameter less than that of the substrate 'W'. According to an example, the spin chuck 832 may chuck the substrate 'W' by vacuum-suctioning the substrate 'W'. Alternatively, the spin chuck 832 may serve as an electrostatic chuck to chuck the substrate 'W' using static electricity. In addition, the spin chuck 832 may chuck the substrate 'W' by physical force.

The rotating shaft 834 and the driver 836 serve as rotation members 834 and 836 to rotate the spin chuck 832. The rotating shaft 834 supports the spin chuck 832 under the spin chuck 832. The rotating shaft 834 is provided such that the longitudinal direction thereof faces a vertical direction. The rotating shaft 834 is provided to be rotatable about the central axis thereof. The driver 836 provides driving force such that the rotating shaft 834 is rotated. For example, the driver 836 may be a motor to change revolution per minute (RPM) of the rotating shaft 834. The rotation members 834 and 836 may rotate the spin chuck 832 at mutually different RPMs depending on substrate treatment stages.

The treating bowl 850 is positioned in the treatment space 812 of the housing 810. The treating bowl 850 is provided to surround the substrate support unit 830. The treating bowl 850 is provided to have a cup shape having an open upper portion. The treating bowl 850 includes an inner cup 852 and an outer cup 862.

The inner cup 852 is provided in a circular plate shape surrounding the rotating shaft 834. When viewed from above, the inner cup 852 is positioned to be overlapped with the inner exhaust port 814. When viewed from above, the top surface of the inner cup 852 is provided such that an outer region and an inner region thereof are inclined at mutually different angles. According to an example, the outer region of the inner cup 852 faces a direction more inclined downward as the outer region becomes gradually away from the substrate support unit 830, and the inner region faces a direction more inclined downward as the inner region gradually becomes away from the substrate support unit 830. A point at which the outer region and the inner region of the inner cup 852 meet each other is provided to correspond to a side end portion of the substrate 'W' in the vertical direction. An outer region of a top surface of the inner cup 852 is provided to be rounded. The outer region of the top surface of the inner cup 852 is provided to be convex down. The outer region of the top surface of the inner cup 852 may be provided as a region in which a treating liquid flows.

The outer cup 862 is provided in the shape of a cup to surround the substrate support unit 830 and the inner cup 852. The outer cup 862 has a bottom wall 864, a sidewall 866, and an inclined wall 870. The bottom wall 864 is provided to have the shape of a circular plate having a hollow. A recovery line 865 is connected to the bottom wall 864. The recovery line 865 recovers the treating liquid supplied on the substrate 'W'. The treating liquid recovered by the recovery line 865 may be reused by an external liquid regeneration system. The sidewall 866 is provided to have the shape of a cylindrical tub to surround the substrate support unit 830. The sidewall 866 extends in a vertical direction from the side end of the bottom wall 864. The sidewall 866 extends upward from the bottom wall 864.

The inclined wall 870 extends inward from the outer cup 862 from the upper end of the sidewall 866. The inclined wall 870 becomes closer to the substrate support unit 830 at the upper portion of the inclined wall 870. The first arm 870 is provided to have the shape of a ring. The upper end of the inclined wall 870 is positioned higher than the substrate 'W' supported by the substrate support unit 830.

The elevating unit 890 moves the inner cup 852 and the outer cup 862 up and down. The elevating unit 890 includes an inner moving member 892 and an outer moving member

894. The inner moving member 892 moves the inner cup 852 up and down, and the outer moving member 894 moves the outer cup 862 up and down.

The liquid feeding unit 840 selectively feeds the first treating liquid, the second treating liquid, and the third treating liquid onto the substrate 'W'. The liquid feeding unit 840 includes a plurality of guide members 846, an arm 848, and a nozzle apparatus 900.

The guide member 846 includes a guide rail 846 that moves the arm 848 in the horizontal direction. The guide rail 846 is positioned at one side of the treating bowl. The guide rail 846 has a longitudinal direction provided in the horizontal direction. The arm 848 is mounted on the guide rail 846. The arm 848 may be moved by a linear motor provided inside the guide rail 846. The arm 848 may be provided to face the longitudinal direction perpendicular to the guide rail 846 when viewed from above. One end of the arm 848 is mounted on the guide rail 846. For another example, the arm 848 may be coupled to a rotating shaft having the longitudinal direction facing the third direction.

The nozzle apparatus 900 may be mounted on a bottom surface of an opposite end of the arm 848. The nozzle apparatus 900 may selectively feed a first treating liquid and a second treating liquid (or third treating liquid) onto the substrate 'W'.

For example, the first treating liquid may be a photosensitive liquid such as a photoresist. For example, the second treating liquid may be a liquid to change the surficial property of the substrate 'W'. The second treating liquid may be a pre-wet liquid to change the surface of the substrate 'W' to a surface having a hydrophobic property. The second treating liquid may be thinner including a solvent and the third treating liquid may be a drying fluid including inert gas.

Figure 8:
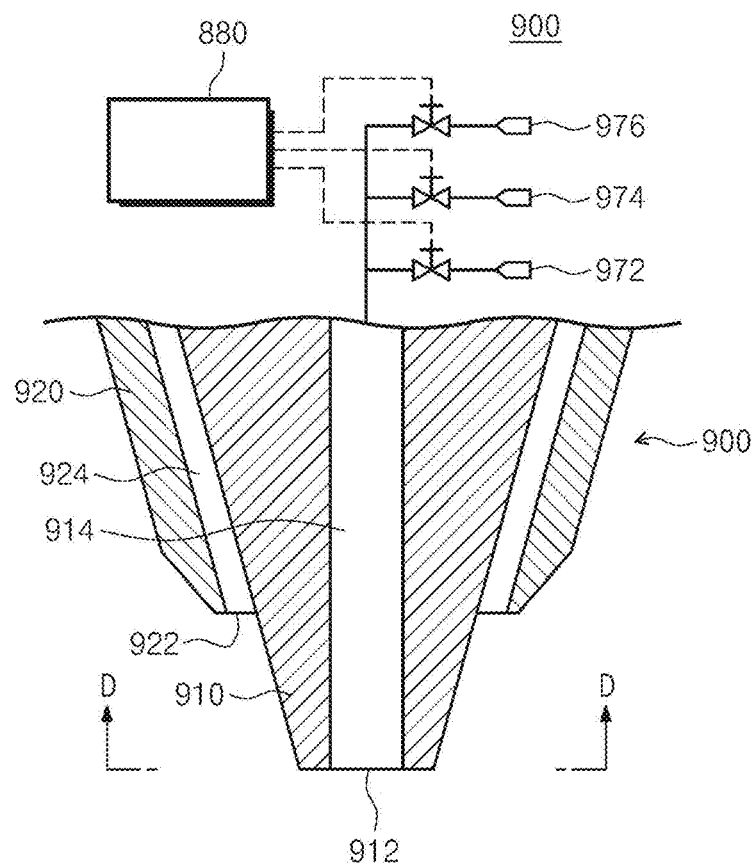
FIG. 8 is a sectional view illustrating a nozzle apparatus illustrated in FIG. 7.
Figure 9:
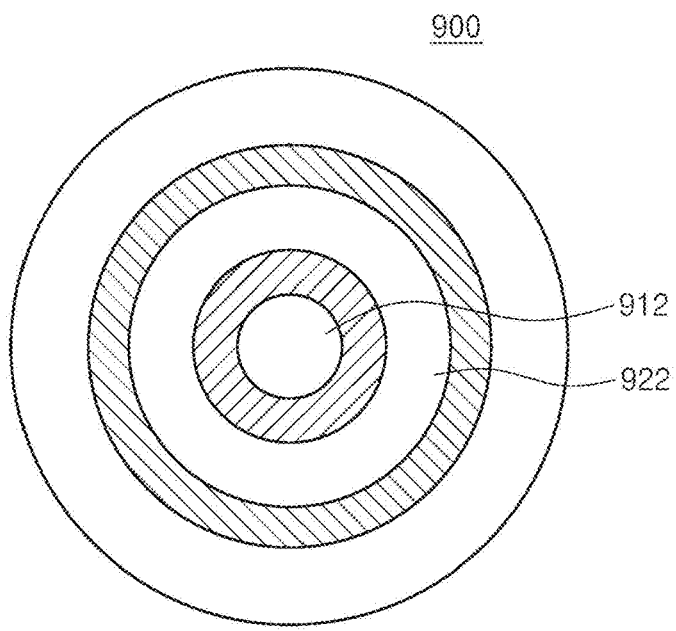
FIG. 9 is a bottom view illustrating a nozzle apparatus when viewed in a direction of D-D as indicated in FIG. 8.

FIG. 8 is a sectional view illustrating the nozzle apparatus illustrated in FIG. 7, and FIG. 9 is a bottom view illustrating the nozzle apparatus when viewed in a direction of D-D as illustrated in FIG. 8.

Referring to FIGS. 8 and 9, the nozzle apparatus 900 may include a plurality of multiple coaxial nozzles. For example, the nozzle apparatus 900 may include a first nozzle 910 to exhaust a photosensitive liquid and a second nozzle 920 to selectively exhaust a solvent or a drying fluid. The nozzle apparatus 900 is positioned at the center of the substrate 'W' to feed the solvent and the photosensitive liquid onto the substrate 'W'.

The first nozzle 910 may have a central exhaust port 912 having a circular sectional surface and may be positioned at the center of the body of the nozzle apparatus 900. The second nozzle 920 may have a first outer exhaust port 922 which is provided in the shape of a ring to form a concentric circle with the central exhaust port 912.

The central exhaust port 912 and the first outer exhaust port 922 are provided to be different from each other in exhaust height. The central exhaust port 912 may be provided to be positioned more closely to the surface (substrate treatment surface) of the substrate to be treated than the first outer exhaust port 922. A first fluid passage 914 of the first nozzle 910 connected to the central exhaust port 912 is connected to a photosensitive liquid feeding part 972, and a second fluid passage 924 of the second nozzle 920 connected to a first outer exhaust port 922 may be connected to a solvent feeding part 974 and a drying fluid (nitrogen gas) feeding part 976.

The central exhaust port 912 of the first nozzle 910 may be provided to face downward in the vertical direction. The first outer exhaust port 922 of the second fluid passage 924 may be provided in parallel to the exposed surface of the first nozzle 910 to face the exposed surface of the first nozzle 910. According to the present embodiment, the exposed surface of the first nozzle 910 is provided to be inclined. Accordingly, the first outer exhaust port 922 may be provided to be inclined in parallel to the exposed surface of the first nozzle 910.

The controller 880 may control the second nozzle 920 to clean the surface of the first nozzle 910 using the solvent before discharging the photoresist liquid from the first nozzle 910.

Figure 10:
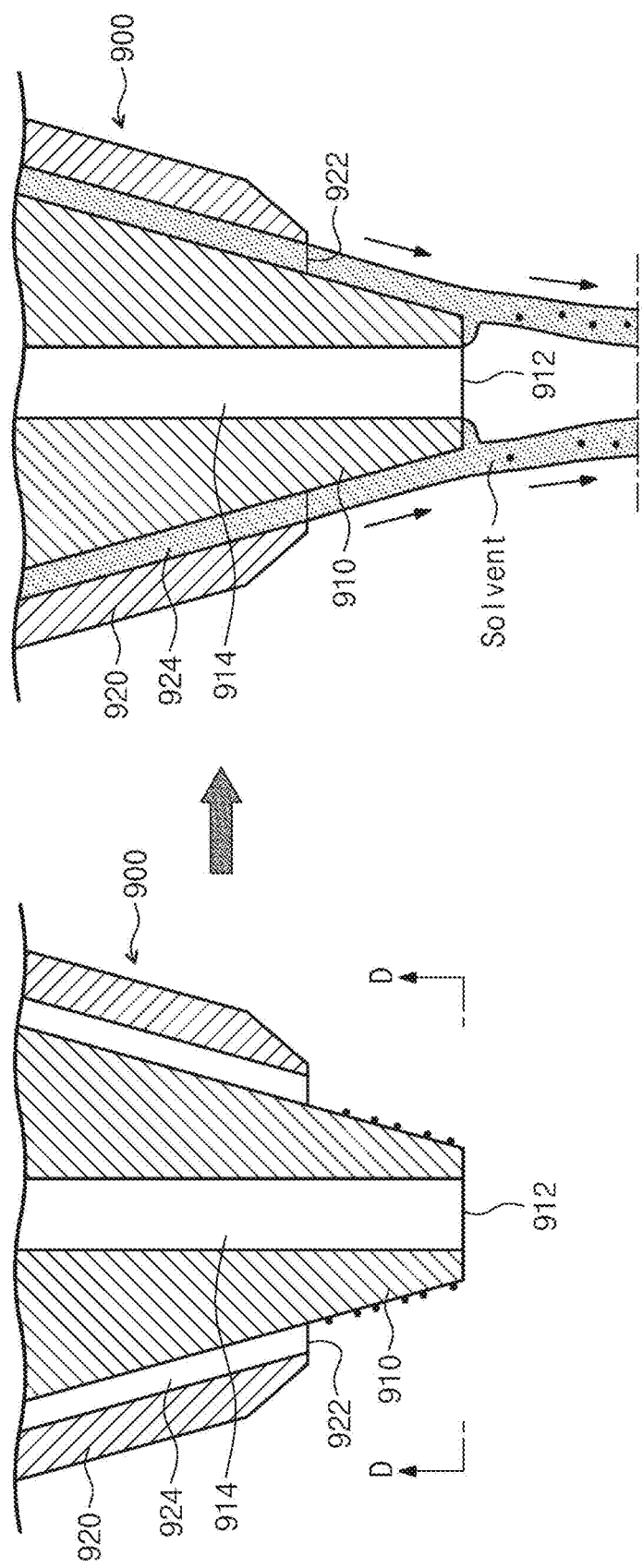
FIG. 10 is a view illustrating a procedure of cleaning a second nozzle by a first nozzle in a nozzle apparatus.

The left side of FIG. 10 illustrates that the surface of a peripheral portion of the central exhaust port 912 of the first nozzle 910 is contaminated, as the photoresist liquid is abnormally scattered when being coated. However, in the case of the contaminated surface of the first nozzle 910, as the solvent is sprayed through the first outer exhaust port 922 of the second nozzle 920 before coating the photoresist liquid as illustrated in the right side of FIG. 10, the solvent flows along the surface (the peripheral portion of the central exhaust port 912) of the first nozzle 910 to clean the surface of the first nozzle 910. The cleaning the surface of the first nozzle 910 may be performed in a pre-wetting step to change the surface state of the substrate to a wet state by feeding the solvent onto the substrate.

In other words, according to the inventive concept, the nozzle is not cleaned through an additional process, but the surface of the first nozzle 910 is cleaned while performing a wetting process by feeding the solvent, which is used as a wetting liquid, through the second nozzle 920 in the pre-wetting step performed before coating the photoresist liquid. For reference, it is preferred that the substrate is rapidly rotated such that a solvent fed in an initial stage in the pre-wetting step is rapidly removed from the substrate surface to prevent the substrate from being contaminated due to particles on the surface of the first nozzle 910.

Figure 11:
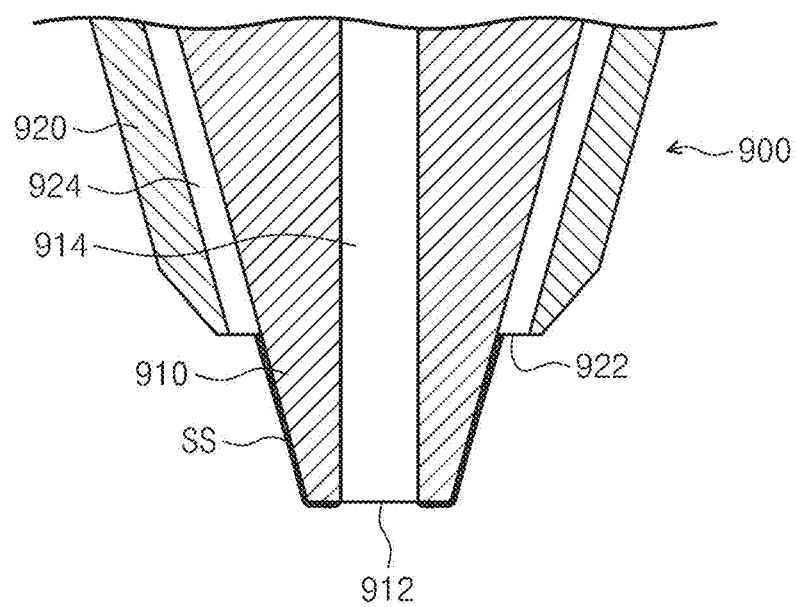
FIG. 11 is a view illustrating a solvent membrane formed on a first nozzle surface.

As illustrated in FIG. 11, a solvent membrane 'SS' may be formed on the surface (especially, the tip of the central exhaust port) of the first nozzle 910 by the solvent exhausted through the first outer exhaust port 922 of the second nozzle 920, in the pre-setting step. The solvent membrane 'SS' formed at the end of the central exhaust port 912 has a remarkable effect to improve 'Cut Off' in the step of feeding a liquid.

Figure 12:
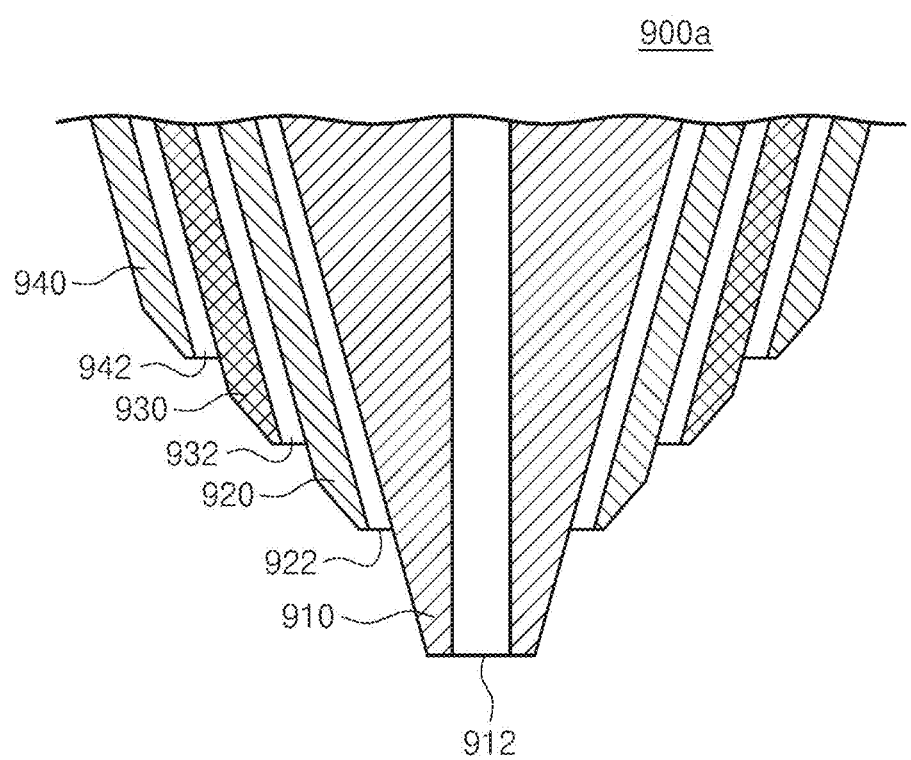
FIG. 12 is a view illustrating another nozzle apparatus.

FIG. 12 is a view illustrating another nozzle apparatus.

In the following description of an embodiment illustrated in FIG. 12, the repeated duplication of parts the same as or corresponding to the previous embodiment described above will be omitted.

According to an embodiment of FIG. 12, a nozzle apparatus 900*a* has a difference from that of the previous embodiment in that the nozzle apparatus 900*a* further includes a third nozzle 930 and a fourth nozzle 940. The third nozzle 930 may have a second outer exhaust port 932 provided in the shape of a ring to form a concentric circle with the central exhaust port 912, and the fourth nozzle 940 may have a third outer exhaust port 942 provided in the shape of a ring to form a concentric circle with the central exhaust port 912. The second outer exhaust port 932 of the third nozzle 930 is positioned farther away from the surface treatment surface than the first outer exhaust port 922. The third outer exhaust port 942 of the fourth nozzle 940 may be provided farther away from the substrate surface treatment than the second outer exhaust port 932.

As described above, in the nozzle apparatus 900*a*, multiple nozzles may be implemented depending on a treating liquid.

The following description will be made regarding a procedure of forming a liquid film on a substrate 'W' using the substrate treating apparatus described above.

Figure 13:
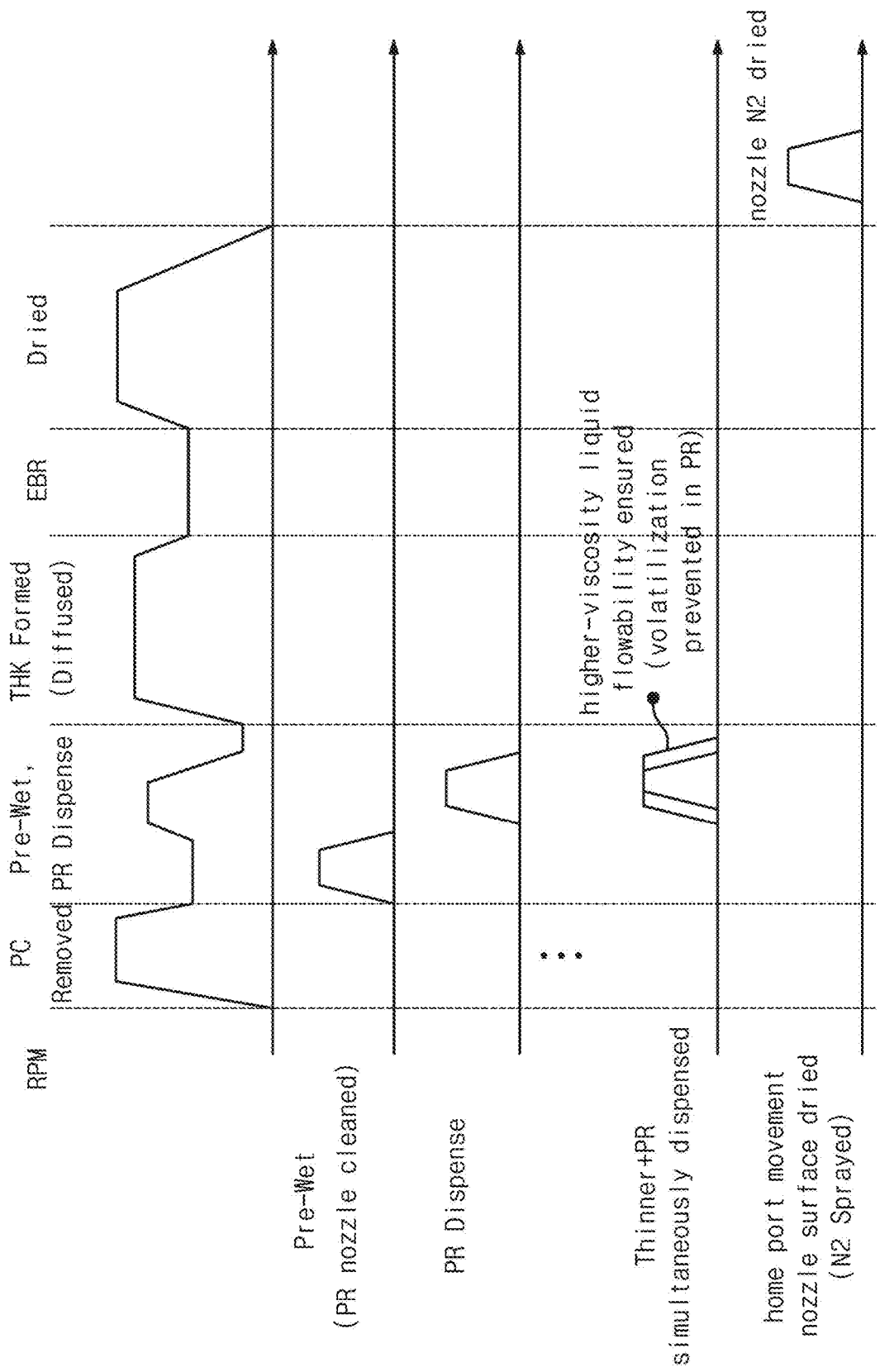
FIG. 13 is a graph illustrating a solvent and a photosensitive liquid which are fed in each process step in a procedure of forming a liquid film.

FIG. 13 is a graph illustrating a photosensitive liquid and a solvent that are fed in each process step in the procedure of forming the liquid film.

Referring to FIG. 13, to form the liquid film on the substrate 'W', a step of removing particles (S10), a pre-wetting step (S20), a step of performing liquid feeding (S30), a step of adjusting a thickness (S40), an edge bead removal (EBR) step of controlling the contamination of an edge of a substrate (S50), and a drying step (S60) are sequentially performed.

The following description will be made only regarding the pre-wetting step (S20) and the step of performing the liquid feeding (S30), and the details of the remaining steps will be omitted.

In the pre-wetting step (S20), the surface state of the substrate 'W' is changed to the wet state by feeding the solvent (wetting liquid) onto the substrate 'W'. The solvent makes the surface of the substrate 'W' having a hydrophobic property. The substrate 'W' may be rotated at a free speed. The solvent is fed onto the substrate 'W' through the second nozzle of the nozzle apparatus. In this procedure, the surface of the first nozzle is cleaned to exhaust the photosensitive liquid. When the pre-wetting step (S20) is finished, the step of performing the liquid feeding (S30) is performed.

The liquid film (PR film) is formed by feeding the photosensitive liquid onto the substrate 'W' in the step of performing liquid feeding (S30). The photosensitive liquid is fed onto the substrate surface through the first nozzle. When the step (S30) of performing the liquid feeding is finished, the step (S40) of adjusting the thickness is performed.

Meanwhile, when the photosensitive liquid has higher viscosity, the solvent and the photosensitive liquid may be simultaneously exhausted.

In the step (S30) of performing the liquid feeding, when the photosensitive liquid is exhausted from the first nozzle 910, the controller 880 may control the first nozzle 910 and the second nozzle 920 to exhaust the solvent together with the photosensitive liquid such that flowability of the photosensitive liquid is increased along the substrate surface. As in the graph, preferably, a start time point of exhausting the solvent is earlier than a start time point of exhausting the photosensitive liquid, and an end time point of exhausting the photosensitive liquid is earlier than an end time point of exhausting the solvent.

When the higher-viscosity photosensitive liquid is dispensed and spread from the center of the substrate to the edge of the substrate, the solvent in the photosensitive liquid is volatilized, so the higher-viscosity photosensitive liquid is not smoothly spread to the edge of the substrate. According to the inventive concept, when the solvent is sprayed together with the photosensitive liquid, the higher-viscosity photosensitive liquid obtains the flowability, which is enhanced by the solvent surrounding the outer peripheral portion of the higher-viscosity photosensitive liquid, to be smoothly spread.

Figure 14:
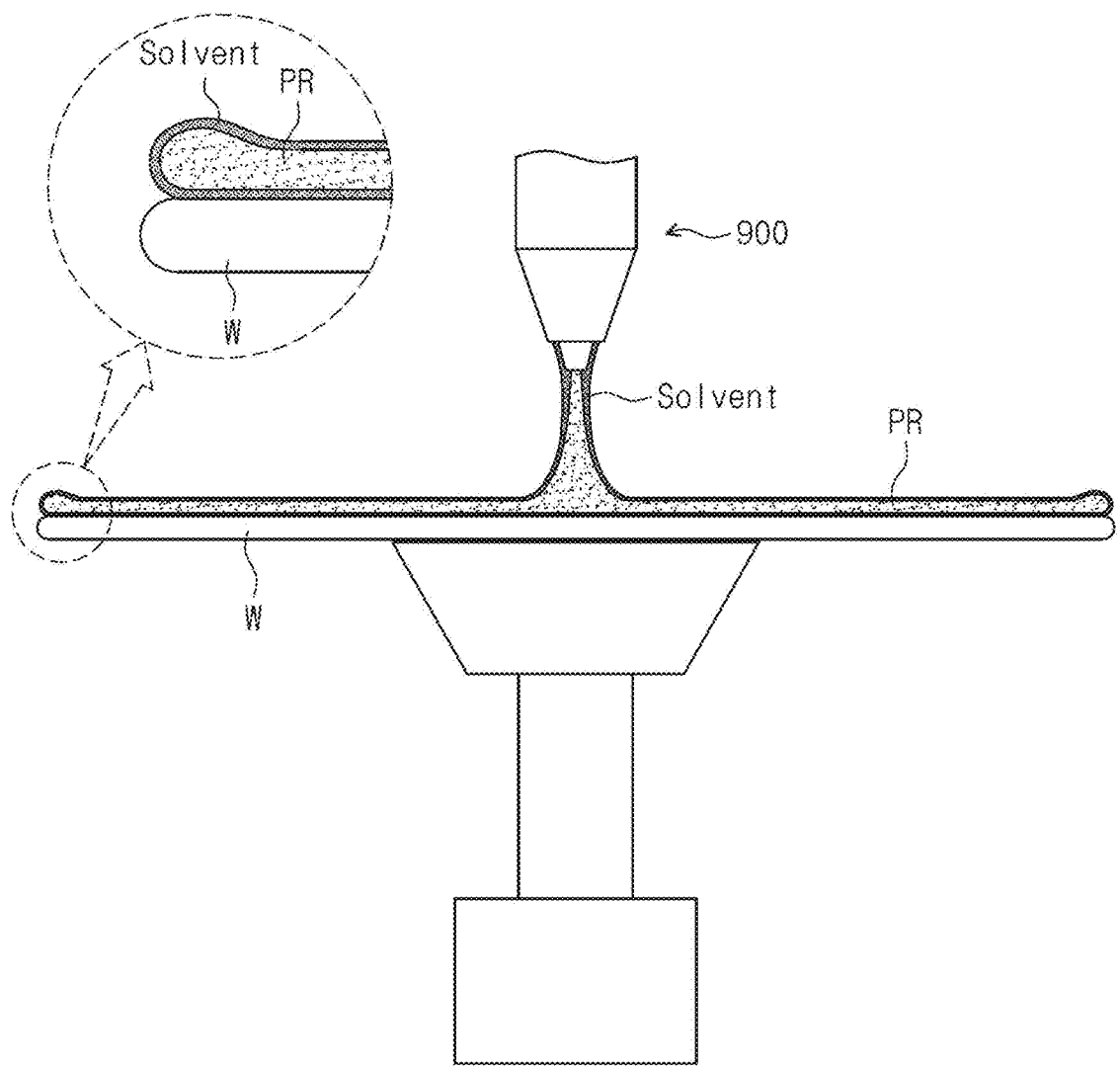
FIG. 14 is a view that a solvent is exhausted together with a photosensitive liquid to enhance the fluidity of the photosensitive liquid.

As described above, when the solvent and the photosensitive liquid are exhausted in the step (S30) of performing the liquid feeding, the solvent membrane may be formed on the photosensitive liquid as illustrated in FIG. 14.

According to an embodiment of the inventive concept, the nozzle may be prevented from being contaminated.

According to an embodiment of the inventive concept, the uniformity may be improved in the shape of spraying the photoresist liquid.

According to an embodiment of the inventive concept, the PM period may be increased.

The effects of the inventive concept are not limited to the above effects. Any other effects not mentioned herein will be clearly understood from the following description by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Accordingly, the technical scope of the inventive concept is not limited to the detailed description of this specification, but should be defined by the claims. It should be understood that the technical protection scope of the inventive concept is not limited to the literary description of the claims itself, but actually the technical value extends even to the invention of the equal scope.

What is claimed is:

1. A nozzle apparatus to exhaust a treating liquid to a substrate treatment surface, the nozzle apparatus comprising:
    a first nozzle having a central exhaust port and configured to exhaust a first liquid; and
    a second nozzle having a first outer exhaust port provided in a shape of ring to form a concentric circle with the central exhaust port and configured to exhaust a second liquid, and
    a nozzle controller configured to control the first nozzle and the second nozzle,
    wherein the nozzle controller is configured to control the second nozzle to clean a surface of the first nozzle using the second treating liquid, before exhausting the first treating liquid from the first nozzle.

2. The nozzle apparatus of claim 1, wherein the central exhaust port and the first outer exhaust port are provided to have mutually different exhaust heights.

3. The nozzle apparatus of claim 2, wherein the central exhaust port is positioned to be provided more closely to the substrate treatment surface than the first outer exhaust port.

4. The nozzle apparatus of claim 3, further comprising:
    a third nozzle having a second outer exhaust port provided in a shape of a ring to form a concentric circle with the central exhaust port,
    wherein the third nozzle is provided to surround the second nozzle.

5. The nozzle apparatus of claim 4, wherein the second outer exhaust port is provided farther away from the substrate treatment surface than the first outer exhaust port.

6. The nozzle apparatus of claim 4, wherein a third treating liquid exhausted from the third nozzle includes a drying fluid.

7. The nozzle apparatus of claim 1, wherein a first treating liquid exhausted from the first nozzle is different from a second treating liquid exhausted from the second nozzle.

8. The nozzle apparatus of claim 7, wherein the first treating liquid includes a photosensitive liquid, and
    wherein the second treating liquid includes a solvent.

9. The nozzle apparatus of claim 1, wherein the nozzle controller is configured to:
    control the first nozzle and the second nozzle to exhaust the second treating liquid together with the first treating liquid, such that flowability of the first treating liquid is increased on a substrate surface, when the first treating liquid is exhausted from the first nozzle.

10. The nozzle apparatus of claim 9, wherein the nozzle controller is configured to:
control the second nozzle such that a start time point of exhausting the second treating liquid is earlier than a start time point of exhausting the first treating liquid, and an end time point of exhausting the second treating liquid is later than an end time point of exhausting the first treating liquid.

11. An apparatus for treating a substrate, the apparatus comprising:
a housing having a treatment space;
a substrate support unit to support and rotate the substrate in the treatment space;
a liquid feeding unit including a nozzle device including a central exhaust port and multiple first outer exhaust ports, which are provided in a shape of a ring to form a concentric circle with the central exhaust port, and configured to feed mutually different treating liquids onto the substrate through respective exhaust ports; and
a controller configured to control the liquid feeding unit,
wherein the controller is configured to control the liquid feeding unit to exhaust a second treating liquid through the first outer exhaust ports such that a peripheral portion of the central exhaust port is cleaned, before exhausting a first treating liquid from the central exhaust port.

12. The apparatus of claim 11, wherein the central exhaust port and the first outer exhaust ports are provided to have mutually different exhaust heights.

13. The apparatus of claim 12, wherein the central exhaust port is positioned to be provided more closely to a substrate treatment surface than the first outer exhaust ports.

14. The apparatus of claim 11, wherein the controller is configured to:
control the liquid feeding unit to exhaust, through the first outer exhaust ports, a second treating liquid together with a first treating liquid, such that flowability of the first treating liquid is increased on a substrate surface, when the first treating liquid is exhausted from the central exhaust port.

15. The apparatus of claim 14, wherein the controller is configured to:
control the liquid feeding unit such that a start time point of exhausting the second treating liquid is earlier than a start time point of exhausting the first treating liquid, and an end time point of exhausting the first treating liquid is earlier than an end time point of exhausting the second treating liquid.

16. The apparatus of claim 11, wherein the first treating liquid includes a photosensitive liquid and the second treating liquid includes a solvent.

17. The apparatus of claim 11, wherein the nozzle device further includes:
a second outer exhaust port provided in a shape of a ring to surround the first outer exhaust ports while forming a concentric circle with the central exhaust port, and
wherein the second outer exhaust port is provided in a stepped form to be farther away from a substrate treatment surface than the first outer exhaust ports.

18. The apparatus of claim 17, wherein a third treating liquid exhausted from the second outer exhaust port includes a drying fluid.

* * * * *